United States Patent [19]

Christensen

[11] 4,035,626

[45] July 12, 1977

[54] PARITY PREDICT NETWORK FOR M-LEVEL N'TH POWER GALOIS ARITHMETIC GATE

[75] Inventor: Bruce Arnold Christensen, Minneapolis, Minn.

[73] Assignee: Sperry Rand Corporation, New York, N.Y.

[21] Appl. No.: 671,884

[22] Filed: Mar. 29, 1976

[51] Int. Cl.$^2$ .................................. G06F 11/10
[52] U.S. Cl. .................................. 235/153 BB
[58] Field of Search ............ 235/153 BB, 152, 156; 340/146.1 AG, 146.1 AL

[56] References Cited

U.S. PATENT DOCUMENTS

| | | | |
|---|---|---|---|
| 3,459,927 | 8/1969 | Geller | 235/153 BB |
| 3,557,356 | 1/1971 | Balza et al. | 235/152 |
| 3,649,817 | 3/1972 | Keller et al. | 235/153 BB |
| 3,699,323 | 10/1972 | Reinheimer | 235/153 BB |
| 3,805,037 | 4/1974 | Ellison | 235/152 |
| 3,922,536 | 11/1975 | Hampel et al. | 235/152 |

OTHER PUBLICATIONS

Bodner, Parity Predict, IBM Technical Disclosure Bulletin, vol. 17, No. 7, Dec. 1974, pp. 2068–2072.

*Primary Examiner*—Charles E. Atkinson
*Attorney, Agent, or Firm*—Kenneth T. Grace; Thomas J. Nikolai; Marshall M. Truex

[57] ABSTRACT

A parity predict circuit for an M-level N'th power Galois arithmetic gate using binary logic elements and a method of the designing thereof is disclosed. The method involves an algorithm that the logic designer utilizes to visually analyze the output of the arithmetic gate using a heuristic technique to determine the procedure for intercoupling the outputs of the gate's 1 through m-1 levels of parity trees as inputs to the parity predict parity tree. This visual analysis obviates the laborious mathematical treatment of the arithmetic gate priorly utilized to design a parity predict network.

16 Claims, 15 Drawing Figures

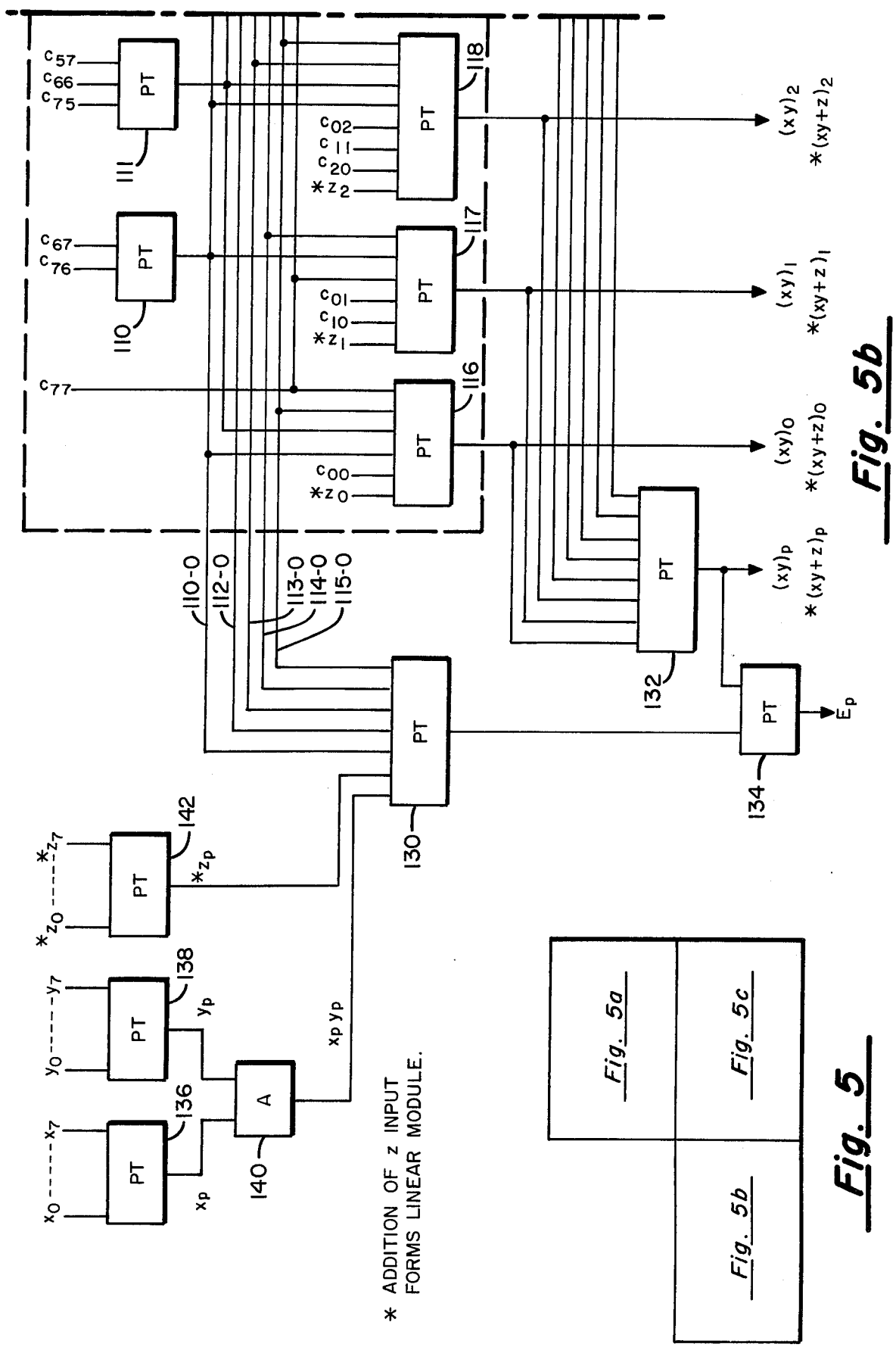

PARITY PREDICT NETWORK FOR M-LEVEL N'TH POWER GALOIS ARITHMETIC GATE

BACKGROUND OF THE INVENTION

In the prior art it is known to design parity predict networks for detecting errors in N'th power Galois arithmetic gates. In the publication "A Cellular-Array Multiplier for GF($2^m$)," B. A. Laws, Jr., et al *IEEE Transactions on Computers*, Dec. 1971, pp. 1573–1578, with particular reference to FIGS. 5 and 6 and the pertinent discussion thereof, there are disclosed methods of designing parity predict networks for a cellular array N'th power Galois multiplication gate. This method of B. A. Laws, et al, is applicable only to a cellular array (as distinguished from a combinatorial array to which the present invention is directed), and, accordingly, is not applicable to all N'th power Galois multiplication gates while yet requiring a rigorous mathematical treatment of the logic terms of the cellular array to determine the appropriate construction of the parity predict network. In contrast, the present invention is directed toward the application of a straight-forward algorithm that by a visual inspection of the manner in which the outputs of the 1 through $m-1$ levels of parity trees are coupled as inputs to the output, $m$-level parity trees determines the particular first level parity tree's outputs that are coupled as inputs to the parity predict network.

SUMMARY OF THE INVENTION

The method of the present invention is directed toward a parity predict network for an M-level, combinatorial array, N'th power Galois arithmetic (linear or multiplication) gate such as that of the J. T. Ellison U.S. Pat. No. 3,805,037. Such a gate includes a matrix of array of $n$, X input lines $x_0, \ldots x_{n-1}$ and $n$, Y input lines $y_0, \ldots y_{n-1}$ that form the $n^2$ intersections $x_0y_0$, $x_0y_1, \ldots x_{n-1}y_{n-2}, x_{n-1}y_{n-1}$ wherein there are $n^2$, two-input AND gates, a separate one having its two inputs coupled across the $x$ input line and the $y$ input line of an associated one of the $n^2$ intersections. The $n^2$ outputs of the $n^2$, two-input AND gates are coupled to a plurality of 1 through $m-1$ levels of parity trees the outputs of which are coupled to $n$, $m$-level parity trees. The $n$ outputs of the $n$, $m$-level of parity trees generate the Galois multiplication resultant $$G(XY) = (XY)_0, \ldots (XY)_{n-1},$$

of the Galois input on the $n$, X input lines of $$G(X) = X_0, \ldots X_{n-1},$$

and of the Galois input on the $n$, Y input lines of $$G(Y) = Y_0, \ldots Y_{n-1}.$$

In the case where $m = 2$, the two-level limitation to the Galois arithmetic gate to which the present invention applies implies that certain ones of the outputs of the $n^2$, two-input AND gates are coupled as inputs to a plurality of parity trees that are collectively defined as a first level of parity trees — it is to be appreciated that $k$-input EXCLUSIVE OR gates, where $k$ is a positive integer of three or greater, are synonymous to a $k$-input parity gate, and may be comprised of the number ($k$-1) of two-input EXCLUSIVE OR gates, see the text "Digital Design," *Wiley-Interscience*, 1971, R. K. Richards, pp. 198–200 — while the outputs of the first level of parity trees (and perhaps certain other ones of the outputs of the $n^2$, two-input AND gates) are coupled as the inputs to $n$, second level of parity trees which $n$, second level parity trees provide as an output therefrom the Galois, e.g., multiplication resultant $$G(XY) = (XY)_0, \ldots (XY)_{n-1}.$$

The algorithm of the present invention consists of the visual analysis of such, e.g., two-level N'th power Galois arithmetic gate and the method of intercoupling certain outputs of the first level of parity trees to a parity predict network (which also has an input thereto the product of the parities $X_pY_p$ of the $X_n$, $Y_n$ inputs that are the inputs to the arithmetic gate) to provide as an output therefrom the parity predict $P_p$. This parity predict $P_p$ may then be combined with the parity of the product $(XY)_p$, which is generated from the outputs of the n, second level parity trees, as inputs to a parity error indicator parity tree, e.g., an EXCLUSIVE OR gate, to generate as an output therefrom the parity error indicator $E_p$. The parity predict network is a parity tree whose terms are such that the following properties hold for it in combination with the outputs of the arithmetic gate's first level of parity trees, the outputs of which are the inputs to the gate's second level of parity trees:

the output of every first level parity tree that is an input to an even number, i.e., has an even fan-out, of second level parity trees is also coupled as an input to the parity predict parity tree;

the output of any first level parity tree that is an input to an odd number, i.e., has an odd fan-out, of second level parity trees is not coupled as an input to the parity predict parity tree.

DESCRIPTION OF THE PREFERRED EMBODIMENT

Figure 1:
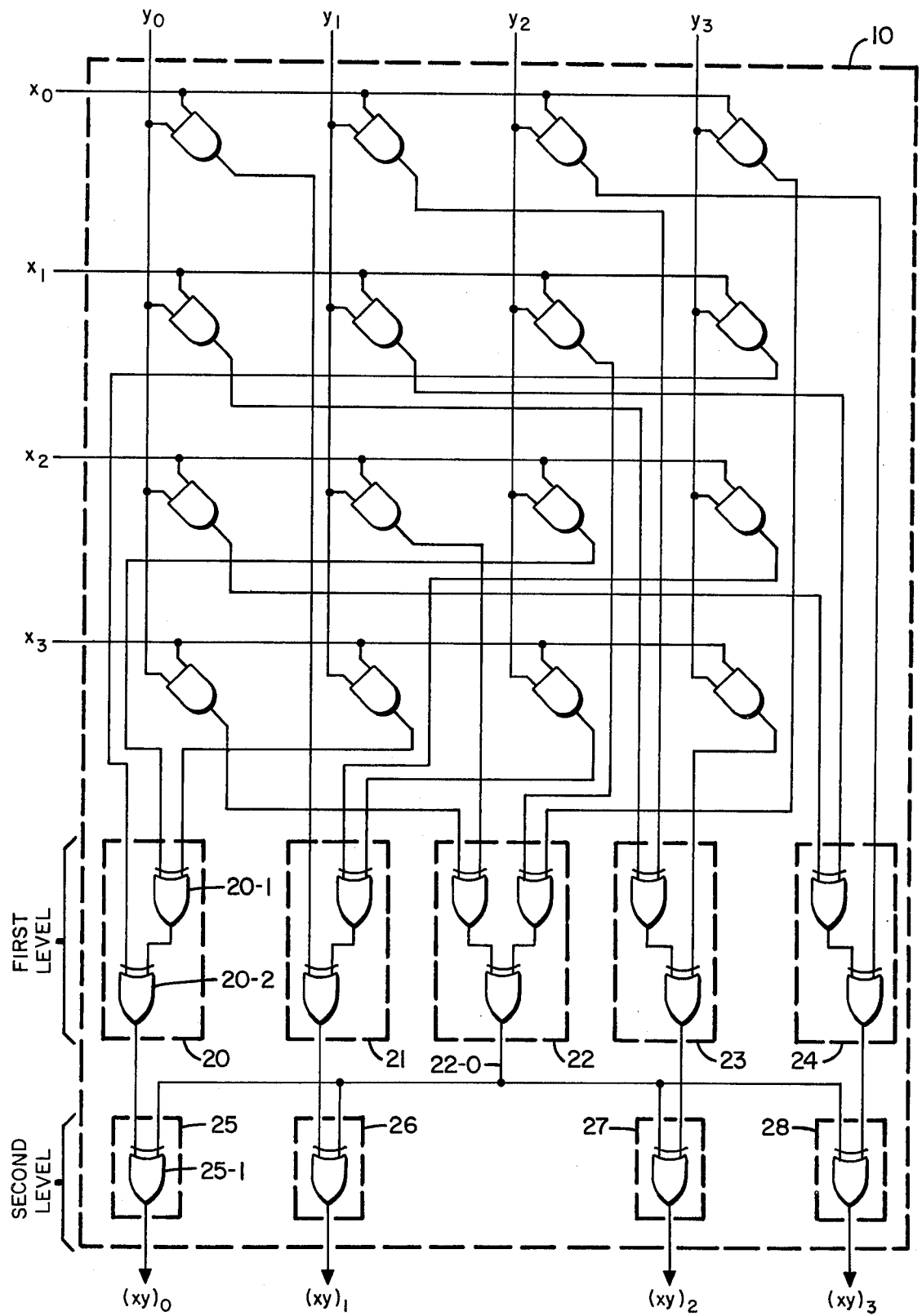
FIG. 1 is a logic level diagram of a prior art combinatorial array, two-level, N'th power [where $GF(2^n)$, $n = 4$] Galois multiplication gate to which the present invention is applicable.

With particular reference to FIG. 1 there is presented a logic level diagram of a prior art combinatorial array, two-level, N'th power [where $GF(2^n)$, $n = 4$] Galois multiplication gate 10 to which the present invention is applicable. In the publication "Galois Logic Design," J. T. Ellison, et al, *AFCRL*-70-0583, obtainable from Data Sciences Laboratory, Air Force Cambridge Research Laboratories, Air Force Systems Command, United States Air Force, Bedford, Massachusetts, 01730, there has been developed a general method for configuring a plurality of AND gates and EXCLUSIVE OR gates into an M-level, N'th power, Galois multiplication gate such as the arithmetic gate 10 of FIG. 1. In the J. T. Ellison U.S. Pat. No. 3,805,037, there is disclosed a method of converting such multiplication gate 10 into a linear gate by the addition of $n$, Z input lines to the $n$, output EXCLUSIVE OR gates (parity trees). The present invention builds upon these prior art arithmetic (multiplication and linear) gates, a parity predict network for determining the validity vel non of the output of the arithmetic gate 10. Thus, the embodiment of FIG. 1 is acknowledged prior art.

Figure 2:
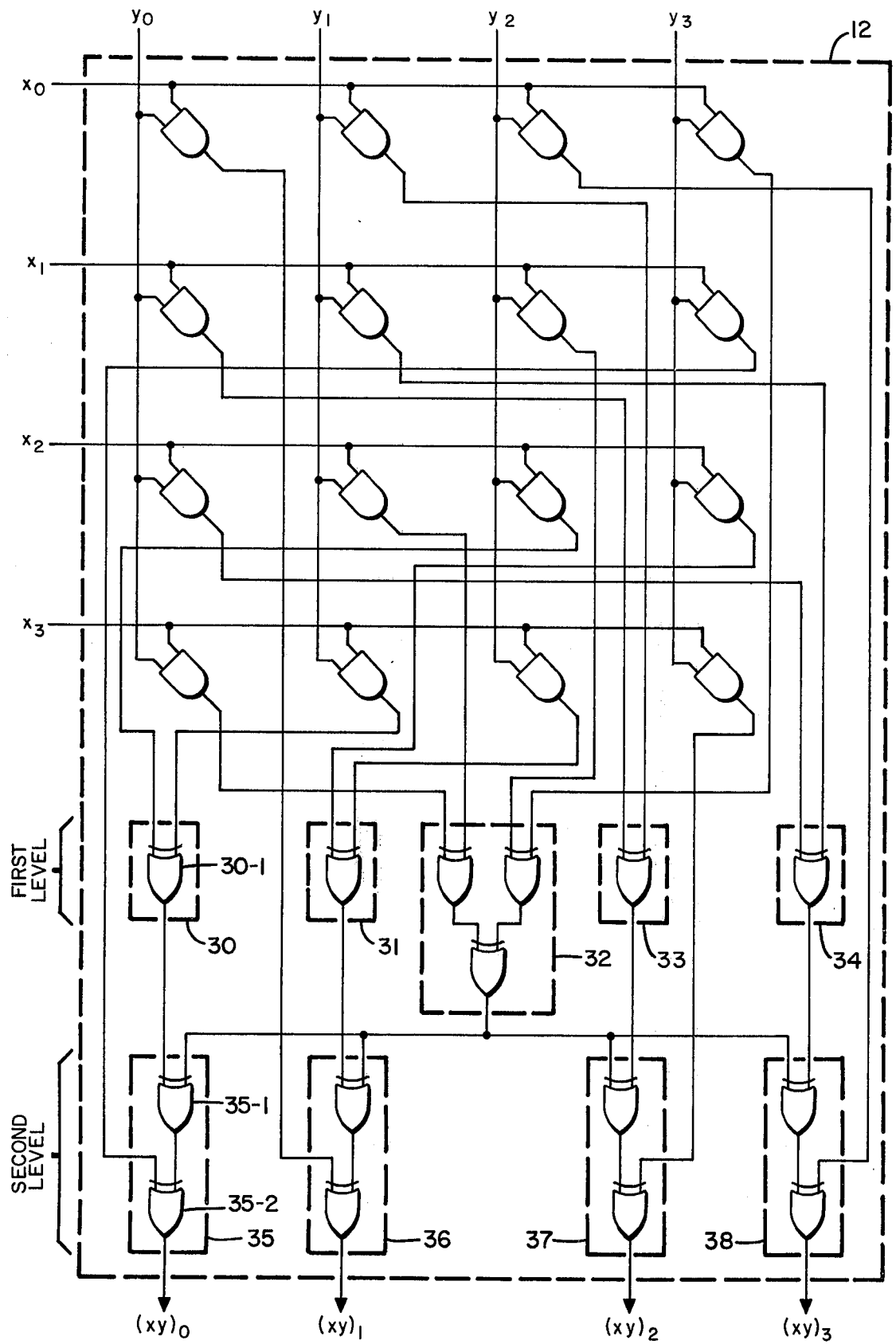
FIG. 2 is a logic level diagram of a Galois multiplication gate similar to that of FIG. 1 but in which the first level parity trees and the second level parity trees have a different logic conformation.

With particular reference to FIG. 2 there is presented a logic level diagram of a Galois multiplication gate 12 similar to that of FIG. 1 but in which the first level of parity trees and the second level of parity trees have a different logic conformation. It is to be recognized that the logic design of multiplication gates 10 and 12 are substantially similar, the only distinction being the particular conformation or method of intercoupling the $n^2$ AND gates to a plurality of first level parity trees and a second level of parity trees — both conformations generating the same Galois multiplication resultant $$G(XY) = (xy)_0, \ldots (xy)_{n-1}.$$

Accordingly, for the purpose of defining the applicability of the present invention it is hereby stated that the present invention is limited to an M-level, N'th power, Galois arithmetic gate comprised of a matrix array of $n$, X input lines $x_0, \ldots x_{n-1}$ and $n$, Y input lines $y_0, \ldots y_{n-1}$ for forming the $n^2$ intersections $x_0y_0, x_0y_1, \ldots x_{n-1}y_{n-2}, x_{n-1}y_{n-1}$;

$n^2$, two-input AND gates, a separate one having its two inputs coupled across the X input line and the Y input line of an associated one of said $n^2$ intersections;

a plurality of 1 through $m$-1 levels of parity trees;

$n$, output, $m$-level parity trees;

means intercoupling said $n^2$ AND gates, said plurality of 1 through $m$-1 levels of parity trees and said $n$, output, $m$-level parity trees for generating as the outputs of said $n$, output, $m$-level parity trees, the Galois arithmetic resultant; wherein each of said 1 through $m$ levels of parity trees is defined as a level of parity trees whose inputs are the outputs of said Galois arithmetic gate's $n^2$ AND gates or the outputs of lower level parity trees and in which there are no internal fan-outs greater than 1 but which has at least one output that has a number of fan-outs greater than 1, and wherein said output, m-level of parity trees is defined as a level of parity trees in which there are no internal fan-outs greater than 1 and whose $n$, outputs are the outputs of the Galois arithmetic gate.

With particular reference to the arithmetic gates 10, 12 of FIGS. 1, 2, J. T. Ellison in the above referenced publication derived a general method for configuring a plurality of AND gates and EXCLUSIVE OR gates into a two-level (first and second level parity trees at the output of the gates 10, 12) N'th power, Galois arithmetic gate. The equations for the outputs are $(xy)_0 = x_2y_1 \oplus x_3y_1 \oplus x_1y_2 \oplus x_2y_2 \oplus x_0y_3 \oplus x_1y_3 \oplus x_2y_3$
$(xy)_1 = x_0y_1 \oplus x_3y_1 \oplus x_2y_2 \oplus x_3y_2 \oplus x_0y_3 \oplus x_2y_3 \oplus x_1y_3$
$(xy)_2 = x_2y_0 \oplus x_1y_1 \oplus x_0y_2 \oplus x_3y_2 \oplus x_0y_3 \oplus x_2y_3 \oplus x_1y_3$
$(xy)_3 = x_1y_0 \oplus x_2y_0 \oplus x_0y_1 \oplus x_3y_1 \oplus x_2y_2 \oplus x_3y_2 \oplus x_1y_3.$ The parity equations for the inputs are:

$xp = x_0 \oplus x_1 \oplus x_2 \oplus x_3$
$yp = y_0 \oplus y_1 \oplus y_2 \oplus y_3.$ The parity of the product is:

$(xy)_p = (xy)_0 \oplus (xy)_1 \oplus (xy)_2 \oplus (xy)_3.$

The sum of the parity of the product, i.e., $(xy)_p$, and the product of the parities, i.e., $x_p y_p$, is:

$(xy)_p \cdot x_p y_p = x_2 y_0 \oplus x_0 y_2 \oplus x_2 y_2 \oplus x_1 y_2.$

This sum is the output of the first level of parity trees, so identified in FIG. 1, that is coupled as an input to each of the four, second level of parity trees, so identified in FIG. 1, such than an error comparison may be obtained by the following equation:

$(xy)_p = x_p y_p \oplus x_2 y_0 \oplus x_0 y_2 \oplus x_2 y_2 \oplus x_1 y_2$ such that any single gate error, e.g., an error caused by the fault or malfunction of any one of the plurality of AND gates and/or EXCLUSIVE OR gates (of the parity trees) may be detected.

A similar type of derivation for a cellular array (as distinguished from a combinatorial array to which the present invention is directed) for an N'th power, Galois multiplication gate may be found in the hereinabove B. A. Laws, et al, publication. The method of the present invention builds upon the derivations of the hereinabove referenced J. T. Ellison and B. A. Laws, et al, publications to provide a method for designing a parity predict network for an M-level, N'th power, Galois arithmetic gate. The method or algorithm of the present invention consists of the visual analysis of such two-level, N'th power, Galois arithmetic gates, such as illustrated in FIGS. 1, 2, and a method of intercoupling certain outputs of the first level parity trees to a parity predict network (which also has as an input thereto the product of the parities) $X_p X_p$ of the $X_n$, $Y_n$ inputs that are the inputs to the arithmetic gates) to provide as an output therefrom the parity predict $P_p$.

As the algorithm of the present invention involves the visual analysis of the intercoupling of the $n^2$ AND gates and the outputs of the lowest, first level through the higher $m$-1 level of parity trees of an M-level N'th power Galois arithmetic gate to the output, $m$-level of parity trees, the definitions, given hereinabove, of such lowest first through the highest $m$ levels of parity trees are now repeated:

the first through the $m$-1 levels of parity trees are each defined as a level of parity trees whose inputs are the outputs of said Galois arithmetic gates $n^2$ AND gates or the outputs of lower level parity trees and in which there are no internal fan-outs greater than 1 but which has at least one output that has a number of fan-outs greater than 1, and, the output, $m$-level of parity trees is defined as a level of parity trees in which there are no internal fan-outs greater than 1 and whose $n$, outputs are the outputs of the Galois arithmetic gate.

The algorithm of the present invention consists of the visual analysis of such, e.g., two-level, N'th power, Galois arithmetic gate and the method of intercoupling certain outputs of the first level parity trees to a parity predict network (which also has as an input thereto the product of the parities) $X_p Y_p$ of the $X_n$, $Y_n$ inputs that are the inputs to the arithmetic gate (to provide as an output therefrom the parity predict $P_p$). The parity predict network is a parity tree whose terms are such that the following properties hold for it in combination with the outputs of the arithmetic gate's first level parity trees, the outputs of which are the inputs to the gate's second level parity trees:

the output of every first level parity tree that is an input to an even number, i.e., has an even fan-out, of second level parity trees is also coupled as an input to the parity predict parity tree;

the output of any first level parity tree that is an input to an odd number, i.e., has an odd fan-out, of second level parity trees is not coupled as an input to the parity predict parity tree.

Using the multiplication gate 10 of FIG. 1 as an example, it can be seen that the first level of parity trees consists of parity trees 20 (e.g., comprised of EXCLUSIVE OR's 20-1 and 20-2), 21, 22, 23 and 24 while the second level of parity trees consists of parity trees 25 (e.g., comprised of EXCLUSIVE OR 25-1), 26, 27, 28. Also, it can be seen that the first level of parity trees 20, 21, 22, 23 and 24 are a level of parity trees whose inputs are the outputs of the $n^2$ AND gates and in which there are no internal fan-outs, i.e., fan-outs internal to the first level of parity trees, greater than 1 but which have at least one output, e.g., output 22-0 of parity tree 22, that has a number of fan-outs greater than 1, i.e., four, which four fan-outs are coupled as inputs to parity trees 25, 26, 27 and 28 of the second level of parity trees. Output 22-0 has an even number of fan-outs, accordingly, output 22-0 of parity tree 22 is also coupled in FIG. 3, as a first input, to parity predict parity tree 44, (e.g., consisting of EXCLUSIVE OR 44-1). Coupled as a second input to parity predict parity tree 44 is the product of the parities $(x_p y_p)$ which is the output of parity predict AND gate 45. The product of the parities, at parity predict AND gate 45 is generated, as the inputs, by the two outputs of $X_p$ parity tree 46 and $Y_p$ parity tree 47, whose respective outputs are $$X_p = x_0 \oplus, \ldots \oplus x_{n-1},$$

which is the parity of the Galois input on said $n$, $X$ input lines, and $$Y_p = y_0 \oplus, \ldots \oplus y_{n-1},$$

which is the parity of the Galois input on said $n$, $Y$ input lines, which $X$ input lines and $Y$ input lines are the respective input lines to gate 10. The output of parity predict parity tree 44 is the parity predict $P_p$ which is the output of the parity predict network formed of:

$Y_p$ parity predict tree 47,
$X_p$ parity predict tree 46,
Parity predict AND gate 45,
Parity predict parity tree 44.

Figure 3A:
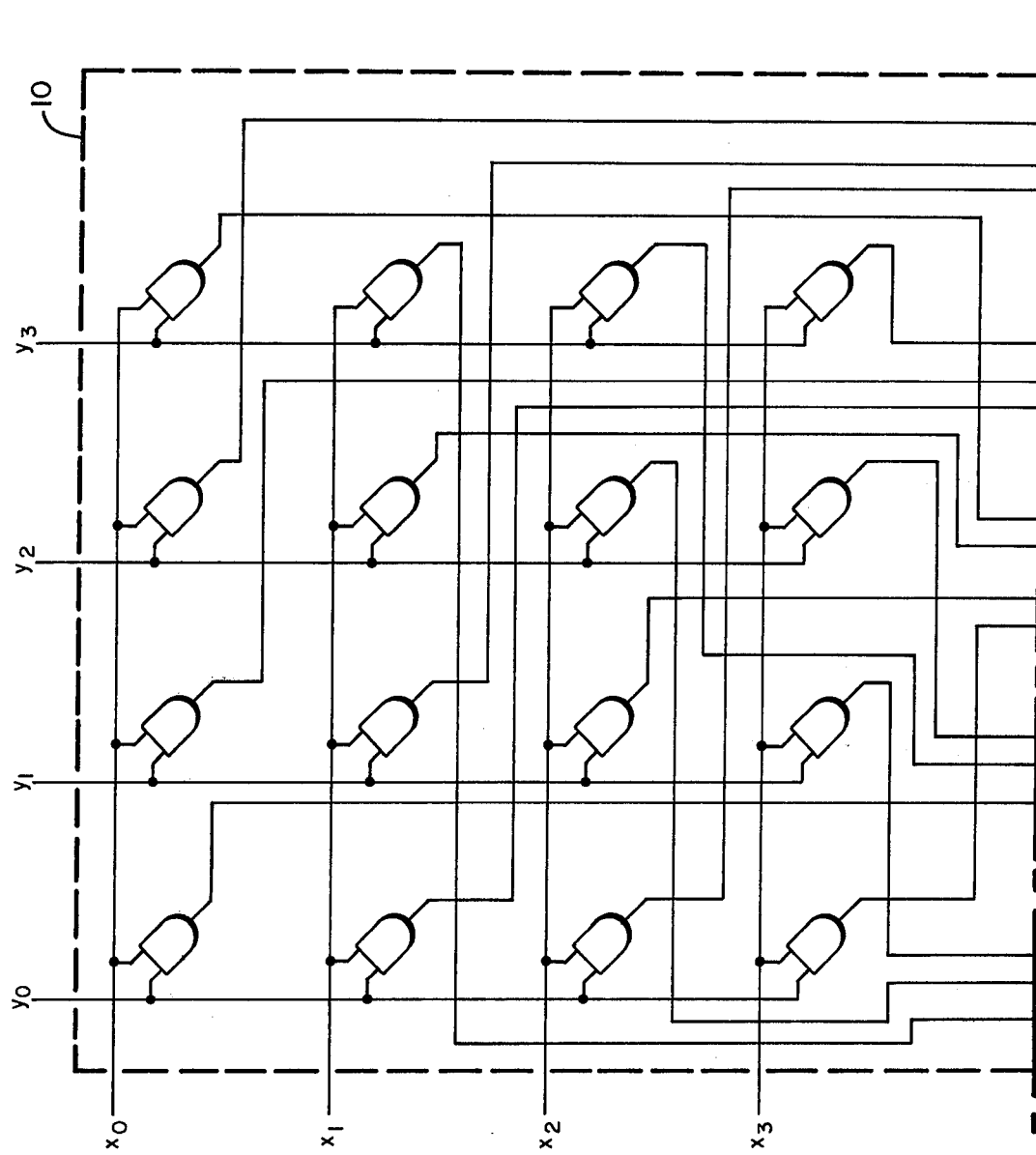
FIG. 3, comprised of FIGS. 3a and 3b, is a logic level diagram of the gate of FIG. 1 to which the parity predict network of the present invention and the parity of the product network and the parity error indicator network have been added.
Figure 3:
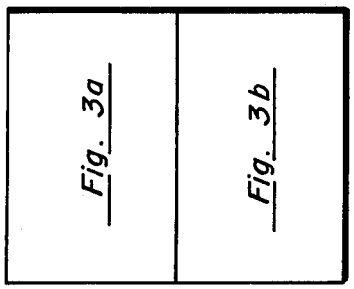
Figure 3B:
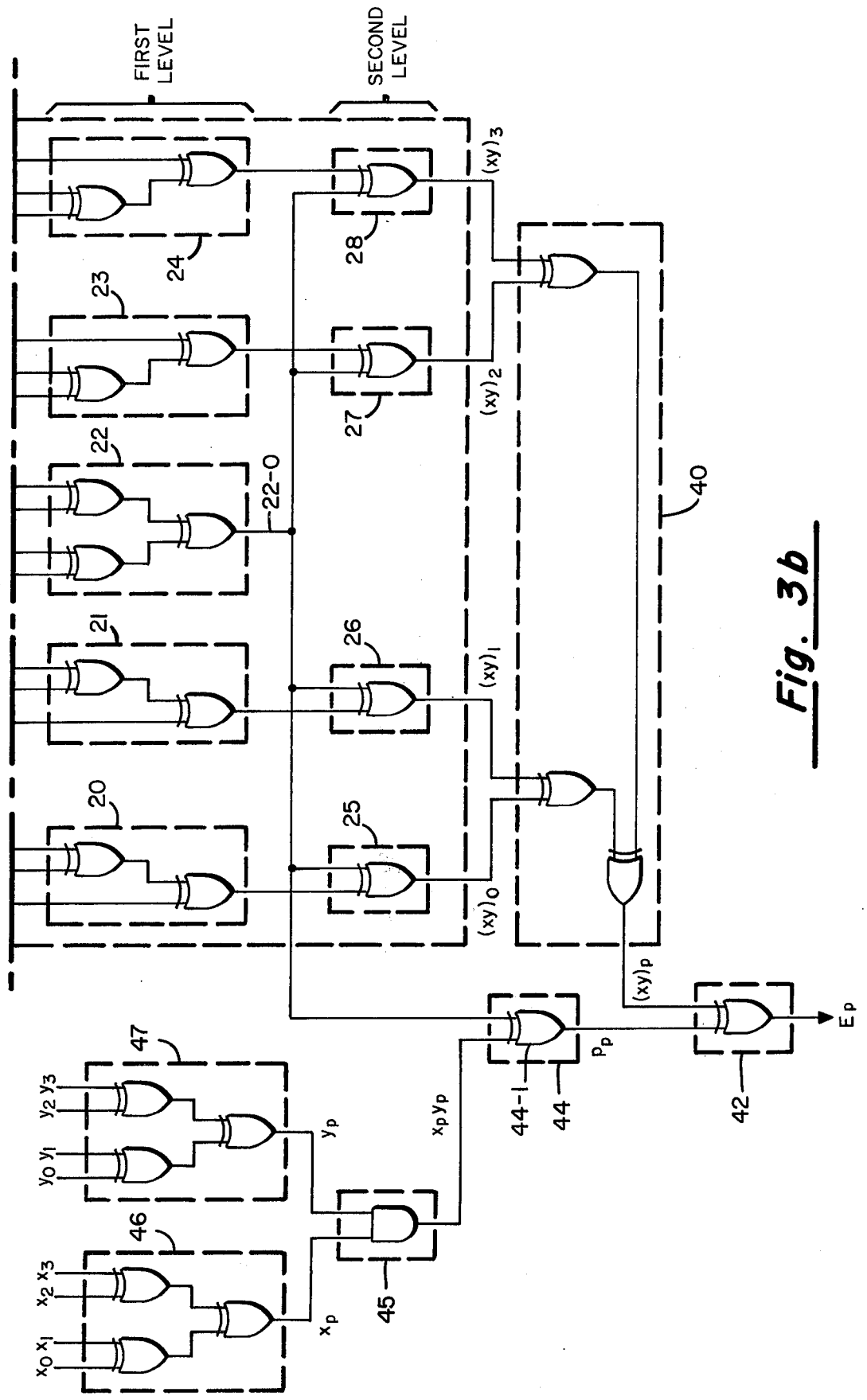

To utilize the parity predict $P_p$ there is further added to multiplication gate 10 the gate resultant parity tree 40 whose inputs are the $n$, outputs of multiplication gate 10, i.e., the Galois multiplication resultant $$G(XY) = (xy)_0, (xy)_1, (xy)_2, (xy)_3$$

whose output is the parity of the product $(xy)_p$. Also added is the parity error indicator parity tree 42 whose two inputs are:

the parity predict $P_p$ from parity predict parity tree 44, the parity of the product $(xy)_p$ from gate resultant parity tree 40, and which provides as an output therefrom, the parity error indicator $E_p$ which indicates the fault or malfunction vel non of any of the AND gates or EXCLUSIVE OR gates of multiplication gate 10 of FIGS. 1, 3.

Figure 4A:
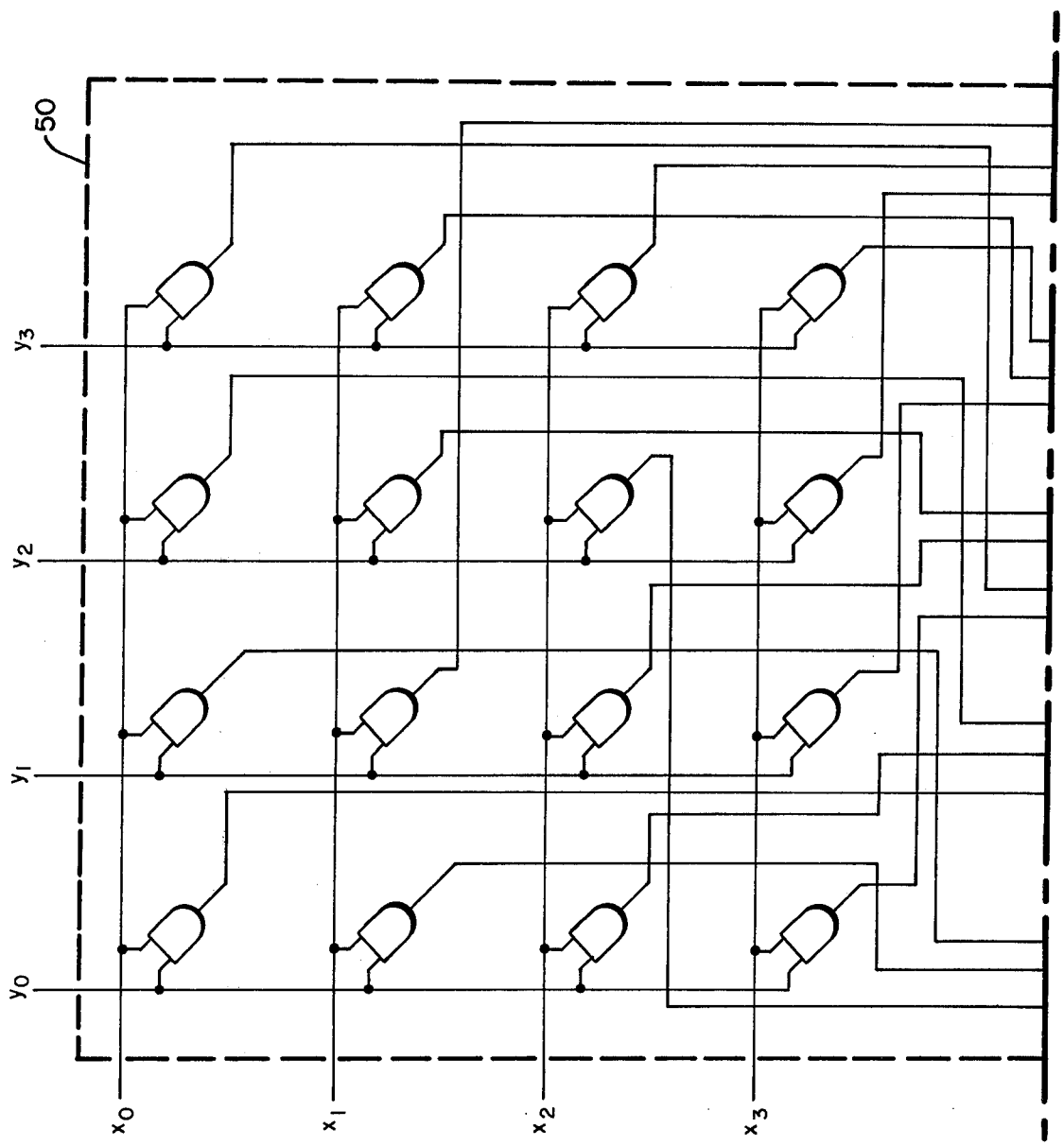
FIG. 4, comprised of FIGS. 4a and 4b, is an illustration of a modification of a multiplication gate similar to that of FIG. 1 for conversion to a linear gate.
Figure 4:
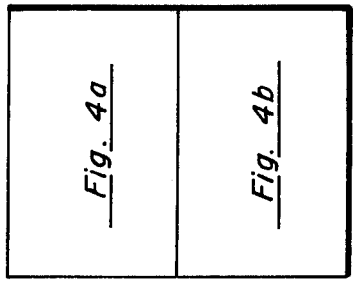
Figure 4B:
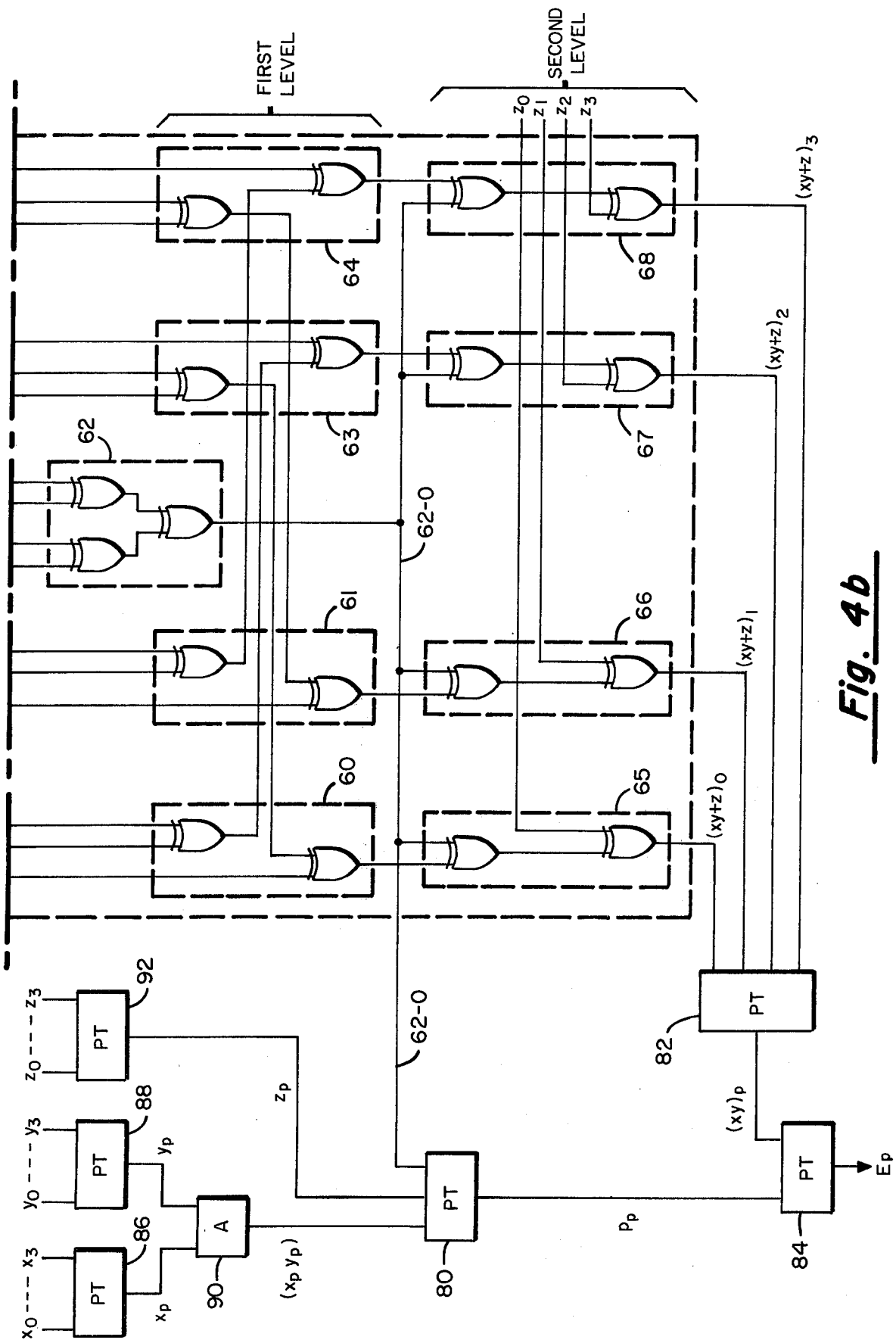

With particular reference to FIG. 4 there is presented an illustration of a modification of a multiplication gate similar to that of FIG. 1 for conversion to a linear gate. Two-level, N'th power, Galois linear gate 50 is similar to that of the hereinabove referenced J. T. Ellison U.S. Pat. No. 3,805,037. As disclosed in such Ellison patent a Galois multiplication gate, which Galois multiplication gate generates the Galois multiplication resultant $$G(XY) = (xy)_0, \ldots (xy)_{n-1}$$

as the output of $n$, output, second level parity trees from the Galois input on $n$, $X$ input lines of $$G(X) = x_0, \ldots x_{n-1},$$

and from the Galois input on $n$, $Y$ input lines of $$G(Y) = Y_0, \ldots Y_{n-1},$$

may be converted to a Galois linear gate by the addition of $n$, $Z$ input lines, a separate one coupled as an input to an associated separate one of said $n$, output, second level parity trees for generating as the output of said $n$, output, second level parity trees the Galois linear resultant $$G(XY+Z) = (xy+z)_0, \ldots (xy+z)_{n-1}.$$

In the illustrated configuration of the Galois linear gate 50 of FIG. 4 it can be seen that the first level parity trees consist of parity trees 60, 61, 62, 63 and 64 while the second level parity trees consist of parity trees 65, 66, 67 and 68 with parity tree 62 having an even number of fan-outs greater than 1, e.g., four. Accordingly, as with the above discussion, particularly with respect to FIGS. 1 and 3, the output of parity tree 62 at line 62-0 is coupled, as an input, to parity predict parity tree 80. Also coupled to parity of the product parity tree 82, as inputs, are the outputs $$G(XY+Z) = (xy+z)_0, (xy+z)_1, (xy+z)_2, (xy+z)_3$$

for providing as an output therefrom the parity of the product $(xy+z)_p$ which is coupled as a first input to parity error indicator parity tree 84. Coupled to parity predict parity tree 80, via parity predict AND gate 90, is the product of the parity $x_p y_p$ that is generated by the $X_p$ parity tree 86 and the $Y_p$ parity tree 88 while coupled to parity predict parity tree 80 as a third input thereto is parity of the Galois input on the $n$, $Z$ input lines, $Z_p$, generated by $Z_p$ parity tree 92. With the parity predict $P_p$ from parity predict parity tree 80 coupled to parity error indicator parity tree 84 as a second input thereto there is provided as an output therefrom the parity error indicator $E_p$, all in a manner similar to that discussed with particular reference to FIGS. 1, 3 and 4.

Figure 5A:
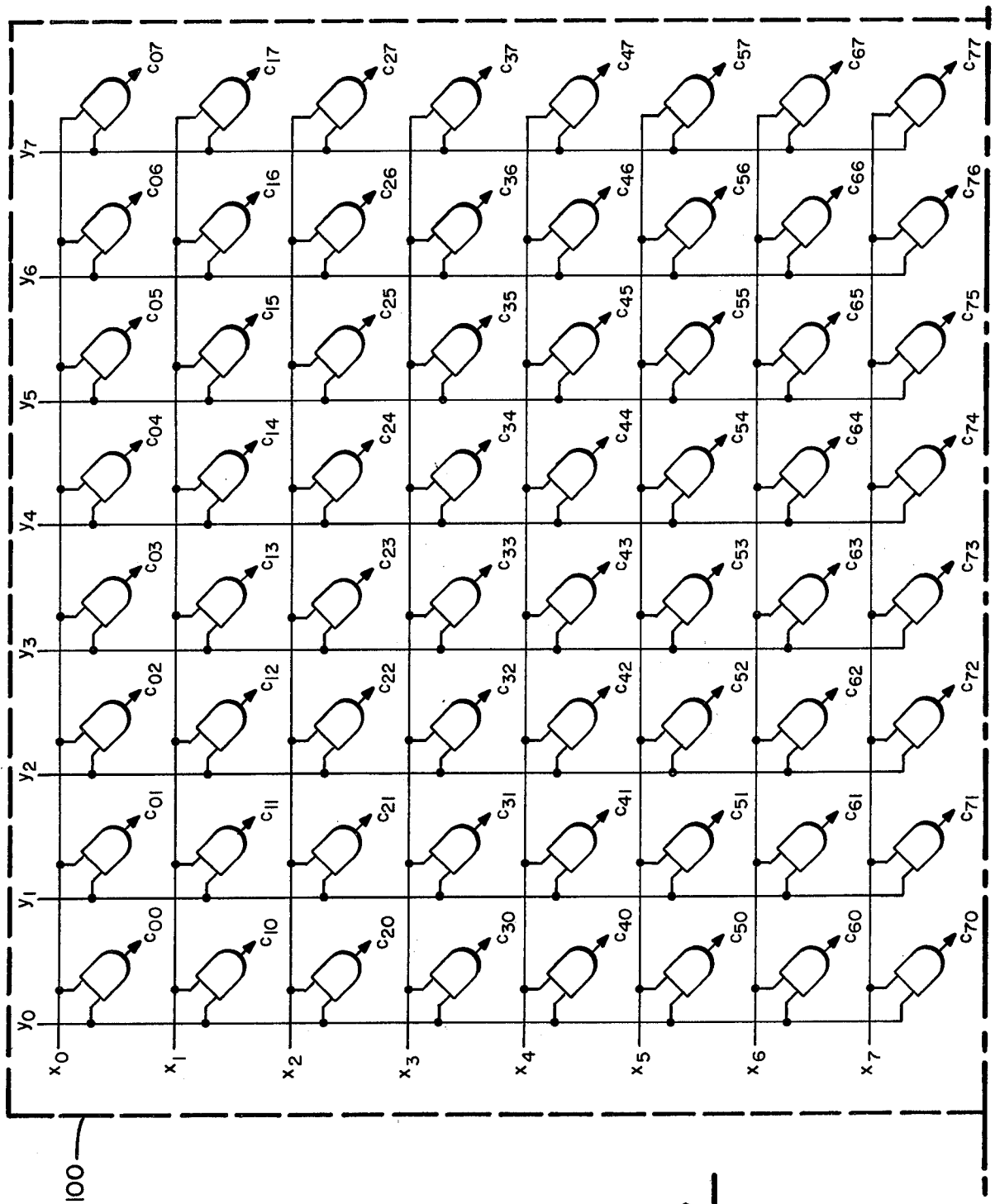
FIG. 5, comprised of FIGS. 5a, 5b, and 5c, is a block diagram of another embodiment of the present invention that is directed toward a two-level, N'th power, Galois arithmetic gate, where $GF(2^n)$, $n = 8$.
Figure 5C:
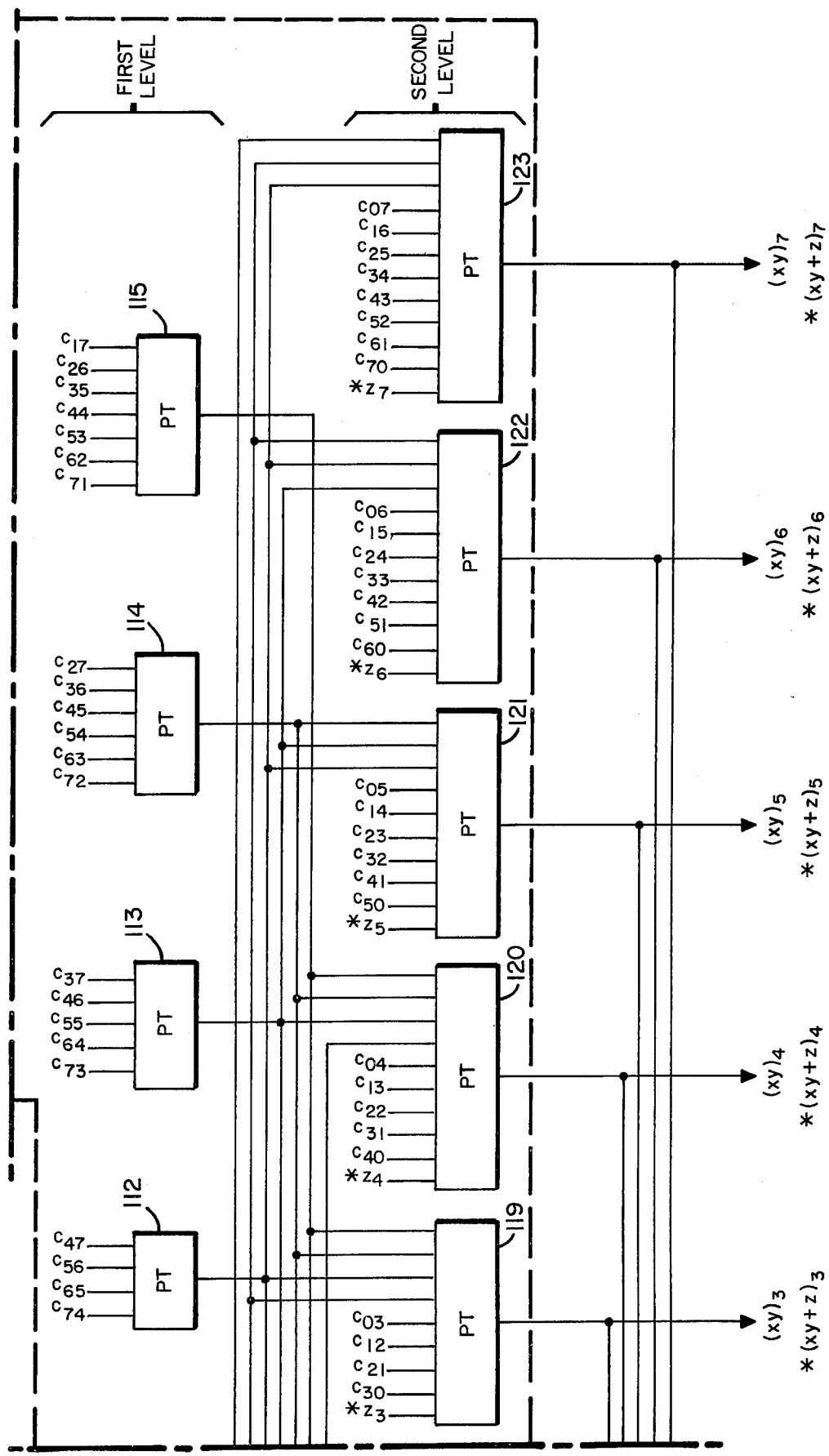

With particular reference to FIG. 5 there is presented a block diagram of another embodiment of the present invention that is directed toward a two-level, N'th power, Galois arithmetic (multiplication or linear) gate where GF($2^n$), $n = 8$. In this configuration of Galois arithmetic gate 100, where GF($2^n$), $n = 8$, there is illustrated a matrix array of eight X input lines and eight Y input lines for forming 64 intersections wherein 64 AND gates (having the associated 64 output lines designated $C_{00}$ through $C_{77}$) are coupled across the X input lines and the Y input lines of an associated one of the 64 intersections. As in previous discussions, there are two-levels of parity trees: first level parity trees consisting of parity trees 110, 111, 112, 113, 114 and 115 and $C_{77}$ and output, second level parity trees 116, 117, 118, 119, 120, 121, 122 and 123.

Visual analysis of the outputs of the first level parity trees 110 through 115 and of the outputs $C_{00}$ through $C_{77}$ of the 64 AND gates indicates that parity trees 110, 112, 113, 114 and 115 have an even number of fan-outs:

parity tree 110 has four fan-outs: to second level parity trees 116, 117, 118, 123;
parity tree 112 has four fan-outs: to second level parity trees 119, 121, 122, 123;
parity tree 113 has four fan-outs: to second level parity trees 118, 120, 121, 122;
parity tree 114 has four fan-outs: to second level parity trees 117, 119, 120, 121;
parity tree 115 has four fan-outs: to second level parity trees 116, 118, 119, 120.

Accordingly, the outputs of first level parity trees 110, 112, 113, 114, and 115, i.e., outputs 110-0, 112-0, 113-0, 114-0, and 115-0 are coupled as separate inputs to parity predict parity tree 130. Also, as before, the $n$, outputs of the $n$, second level parity trees 116, 117, 118, 119, 120, 121, 122, 123 are coupled as separate inputs to parity of the product parity tree 132 while the parity predict $P_p$ from parity predict parity tree 130 and the parity of the product $(xy)_p$ from the parity of the product parity tree 132 are coupled as separate inputs to the parity error indicator parity tree 134 for generating the error indicator $E_p$ as an output therefrom.

Note that as before, the parity of the Galois input on the eight, X input lines from $X_p$ parity tree 136 and the parity of the Galois input on the eight, Y input lines $Y_p$ from $Y_p$ parity tree 138, both via parity predict AND gate 140, and the parity of the Galois input on the eight, Z input lines $Z_p$ from $Z_p$ parity tree 142 are coupled as additional inputs to the parity predict parity tree 130.

For ease of reading the logic configuration of the first and second level parity trees, of the arithmetic gate 100 of FIG. 5, the outputs of the 64 AND gates of the matrix array of gate 100 are designated by the references $C_{00}$ through $C_{77}$ with the corresponding references $C_{00}$ through $C_{77}$ noted at their respective inputs to the first level parity trees 110-115 and the second level parity trees 116-123. Also, conversion of the multiplication gate to a linear gate is denoted by the optional addition of 8, Z inputs $z_0$ through $z_7$ at their respective inputs to the second level parity trees 116-123 and $Z_p$ parity tree 142. This optional conversion, by the addition of the 8, Z inputs $z_0$ through $z_7$ which is denoted by the asterisk associated with the associated references, then converts the Galois multiplication resultant $$G(XY) = (xy)_0, \ldots (xy)_7$$

to the Galois linear resultant $$G(XY+Z) = (xy+z)_0, \ldots (xy+z)_7$$

all in a manner similar to that disclosed in the hereinabove referenced J. T. Ellison U.S. Pat. No. 3,805,037.

Figure 6A:
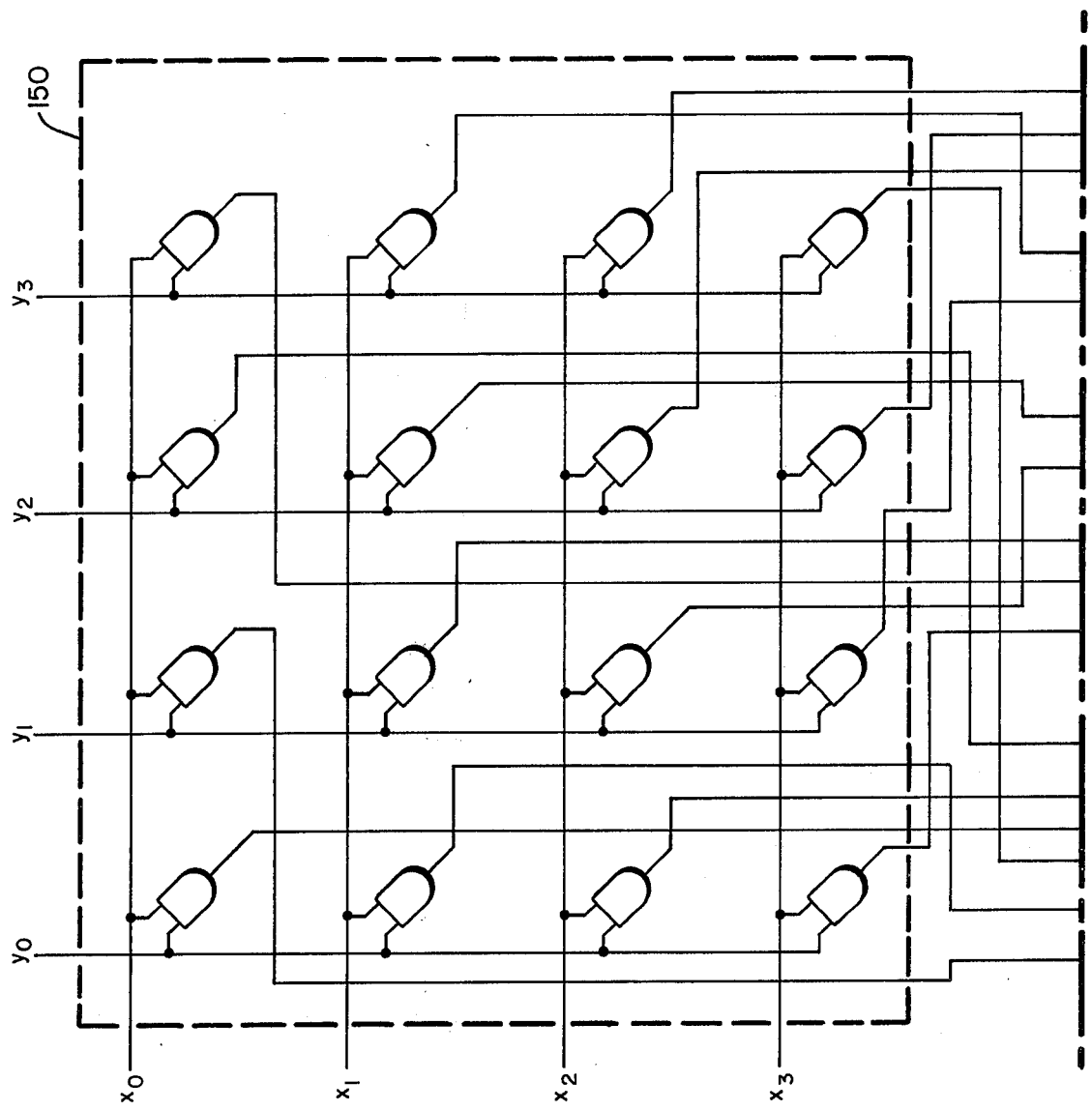
FIG. 6, comprised of FIGS. 6a, and 6b, is a block diagram of a prior art combinatorial array, three-level N'th power Galois multiplication gate to which the present invention is applicable.
Figure 6B:
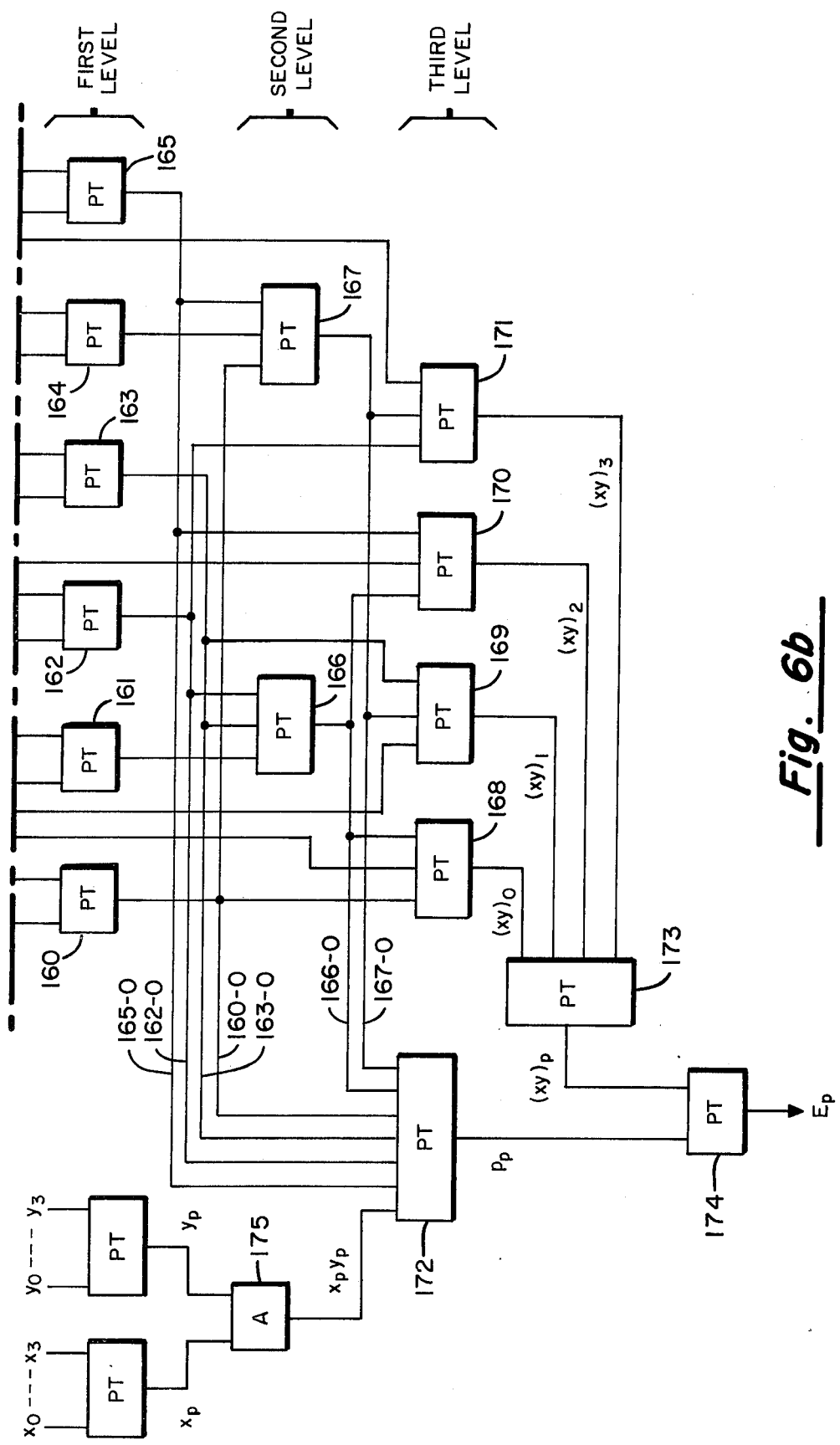

With particular reference to FIG. 6 there is illustrated a block diagram of a prior art combinatorial array, M-level ($M = 3$), N'th power ($N = 4$), Galois multiplication gate 150 to which the present invention is applicable. In this embodiment of the present invention the lowest, first level of parity trees consists of parity trees 160, 161, 162, 163, 164, and 165, the next-lowest, second ($m$-1) level of parity trees consists of parity trees 166 and 167 and the highest, output, third ($m$) level of parity trees consists of $n$ ($n = 4$), parity trees 168, 169, 170 and 171. Also, it can be seen that each of the $m = 3$ levels of parity trees has no internal fan-out greater than 1, but that the first and the second levels of parity trees each have at least one output that has a fan-out greater than 1:

level 1:
parity tree 160 has two fan-outs: to second level parity tree 167 and to third level parity tree 168;
parity tree 162 has two fan-outs: to second level parity tree 166 and to third level parity tree 171;
parity tree 163 has two fan-outs: to second level parity tree 166 and to third level parity tree 169;
parity tree 165 has two fan-outs: to second level parity tree 167 and to third level parity tree 170.

level 2:
parity tree 166 has two fan-outs: to third level parity trees 168 and 170;
parity tree 167 has two fan-outs: to third level parity trees 169 and 171.

Visual analysis of the outputs of the first and second levels of parity trees and of the outputs of the 16 AND gates is had utilizing an algorithm similar to that given hereinabove with respect to the two-level N'th power Galois arithmetic gates of FIGS. 1, 2, 3, 4 and 5:

the input of every level of parity trees that is an input to an even number of parity trees, i.e., has an even fan-out, is coupled as an input to the parity predict tree. Note that by the previous definition of a level of parity trees there are no fan-outs greater than 1 within a level of parity trees and, accordingly fan-outs greater than 1 exist only as inputs to a level of parity trees.

Using the multiplication gate 150 of FIG. 6, it can be seen that the above algorithm dictates that the outputs of parity trees 160, 162, 163, 165, 166 and 167, i.e., outputs 160-0, 162-0, 163-0, 165-0, 166-0 and 167-0 and the output of the parity predict AND gate 175 are coupled as separate inputs to parity predict parity tree 172. Also, as before, the $n$, outputs of the $n$, third level parity trees 168, 169, 170, 171 are coupled as separate inputs to parity of the product parity tree 173 while the parity predict $P_p$ from parity predict parity tree 172 and the parity of the product $(xy)_p$ from the parity of the product parity tree 173 are coupled as separate inputs to the parity error indicator parity tree 174 for generating the error indicator $E_p$ as an output therefrom.

What is claimed is:

1. A method of constructing a parity predict network for a two-level, N'th power, Galois multiplication gate, which multiplication gate is comprised of:

a matrix array of $n$, X input lines $x_0, \ldots x_{n-1}$ and $n$, Y input lines $y_0, \ldots y_{n-1}$ for forming the $n^2$ intersections $x_0y_0, x_0y_1, \ldots x_{n-1}y_{n-2}, x_{n-1}y_{n-1}$, said matrix array including $n^2$, two-input AND gates, a separate one having its two inputs coupled across the X input line and the Y input line of an associated one of said $n^2$ intersections;

a plurality of first level parity trees;

$n$, output, second level parity trees;

means intercoupling said $n^2$ AND gates, said plurality of first level parity trees and said $n$, output, second level parity trees for generating as the outputs of said $n$, output, second level parity trees, the Galois multiplication resultant $$G(XY) = (xy)_0, \ldots (xy)_{n-1},$$

of the Galois input on said $n$, X input lines of $$G(X) = x_0, \ldots x_{n-1},$$

and of the Galois input on said $n$, Y input lines of $$G(Y) = y_0, \ldots y_{n-1};$$

said method comprising:

coupling the two inputs $$X_p = x_0 \oplus, \ldots \oplus x_{n-1},$$

which is the parity of the Galois input on said $n$, X input lines, and $$Y_p = y_0 \oplus, \ldots \oplus y_{n-1},$$

which is the parity of the Galois input on said $n$, Y input lines as two separate inputs to a parity predict AND gate;

coupling only the outputs of said first level parity trees that are inputs to an even number of said $n$, output, second level parity trees as inputs to a parity predict tree; and, coupling the output of said parity predict AND gate as an input to said parity predict parity tree for generating the parity predict $P_p$ as an output therefrom.

2. The method of claim 1 further including:

coupling the outputs of said $n$, output, second level parity trees to a parity of the product parity tree for generating the parity of the product $(xy)_p$ as an output therefrom;

coupling the output of said parity of the product parity tree as a first input to a parity error indicator parity tree;

coupling the output of said parity predict parity tree as a second input to said parity error indicator parity tree for generating the parity error indicator $E_p$ as an output therefrom.

3. A parity predict network for a two-level Galois multiplication gate that is comprised of:

a matrix array of $n$, X input lines $x_0, \ldots x_{n-1}$ and $n$, Y input lines $y_0, \ldots y_{n-1}$ for forming the $n^2$ intersections $x_0y_0, x_0y_1, \ldots x_{n-1}y_{n-2}, x_{n-1}y_{n-1}$, said matrix array including $n^2$, two-input AND gates, a separate one having its two inputs coupled across the X input line and the Y input line of an associated one of said $n^2$ intersections;

a plurality of first level parity trees;

$n$, output, second level parity trees;

means intercoupling said $n^2$ AND gates, said plurality of first level parity trees and said $n$, output level parity trees for generating as the outputs of said $n$, output, second level parity trees, the Galois multiplication resultant $$G(XY) = (xy)_0, \ldots (xy)_{n-1},$$

of the Galois input on said $n$, X input lines of $$G(X) = x_0, \ldots x_{n-1},$$

and of the Galois input on said $n$, Y input lines of $$G(Y) = y_0, \ldots y_{n-1};$$

said parity predict network comprising:

a parity predict parity tree;

a parity predict AND gate for receiving the two inputs $$X_p = x_0 \oplus, \ldots \oplus x_{n-1},$$

which is the parity of the Galois input on said $n$, X input lines, and $$Y_p = y_0 \oplus, \ldots \oplus y_{n-1},$$

which is the parity of the Galois input on said $n$, Y input lines;

means coupling the output of said parity predict AND gate as an input to said parity predict parity tree;

means coupling only the outputs of said first level parity trees that are inputs to an even number of said $n$, output, second level parity trees as inputs to said parity predict parity tree for generating the parity predict $P_p$ as an output therefrom.

4. The multiplication gate of claim 3 further including:

a parity of the product parity tree;

a parity error indicator parity tree;

means coupling the outputs of said $n$, output, second level parity trees to said parity of the product parity tree for generating the parity of the product $(xy)_p$ as an output therefrom;

means coupling the output of said parity of the product parity tree as a first input to said parity error indicator parity tree; and, means coupling the output of said parity predict parity tree to said parity error indicator parity tree for generating the parity error indicator $E_p$ as an output therefrom.

5. A method of constructing a parity predict network for a two-level, N'th power, Galois linear gate, which linear gate is comprised of:

a matrix array of $n$, X input lines $x_0, \ldots X_{n-1}$ and $n$, Y input lines $y_0, \ldots y_{n-1}$ for forming the $n^2$ intersections $x_0y_0, x_0y_1, \ldots x_{n-1}y_{n-2}, x_{n-1}y_{n-1}$, said matrix array including $n^2$, two-input AND gates, a separate one having its two inputs coupled across the X input line and the Y input line of an associated one of said $n^2$ intersections;

a plurality of first level parity trees;

$n$, output, second level parity trees;

n, Z input lines $z_0, \ldots z_{n-1}$;
means intercoupling said $n^2$ AND gates, said plurality of first level parity trees and said n, output, second level parity trees for generating as the outputs of said n, output, second level parity trees, the Galois linear resultant $$G(XY+Z) = (xy+z)_0, \ldots (xy+z)_{n-1},$$

of the Galois input on said n, X input lines of $$G(X) = x_0, \ldots x_{n-1},$$

of the Galois input on said n, Y input lines of $$G(Y) = y_0, \ldots y_{n-1};$$

and of the Galois input on said n, Z input lines of $$G(Z) = z_0, \ldots z_{n-1};$$

said method comprising:
coupling the two inputs $$X_p = x_0 \oplus \ldots \oplus x_{n-1},$$

which is the parity of the Galois input on said n, X input lines, and $$Y_p = y_0 \oplus \ldots \oplus y_{n-1},$$

which is the parity of the Galois input on said n, Y input lines as two separate inputs to a parity predict AND gate; coupling the input $$Z_p = z_0 \oplus \ldots \oplus z_{n-1},$$

which is the parity of the Galois input on said n, Z input lines as an input to a parity predict parity tree;
coupling the output of said parity predict AND gate as an input to said parity predict parity tree; and,
coupling only to the outputs of said first level parity trees that are inputs to an even number of said n, output, second level parity trees as inputs to said parity predict parity tree for generating the parity predict $P_p$ as an output therefrom.

6. The method of claim 5 further including:
coupling the outputs of said n, output, second level parity trees to a parity of the product parity tree for generating the parity of the product $(XY+Z)_p$ as an output therefrom;
coupling the output of said parity of the product parity tree as a first input to a parity error indicator parity tree;
coupling the output of said parity predict parity tree as a second input to said parity error indicator parity tree for generating the parity error indicator $E_p$ as an output therefrom.

7. A parity predict network for a two-level, Galois linear gate that is comprised of:
a matrix array of n, X input lines $x_0, \ldots x_{n-1}$ and n, Y input lines $y_0, \ldots y_{n-1}$ for forming the $n^2$ intersections $x_0y_0, x_0y_1, \ldots x_{n-1}y_{n-2}, x_{n-1}y_{n-1}$, said matrix array including $n^2$, two-input AND gates, a separate one having its two inputs coupled across the X input line and the Y input line of an associated one of said $n^2$ intersections;
a plurality of first level parity trees;
n, output, second level parity trees;
n, Z input lines $z_0, \ldots z_{n-1}$;
means intercoupling said $n^2$ AND gates, said plurality of first level parity trees and said n, output level parity trees for generating as the outputs of said n, output, second level parity trees, the Galois multiplication resultant $$G(XY) = (xy)_0, \ldots (xy)_{n-1},$$

of the Galois input on said n, X input lines of $$G(X) = x_0, \ldots x_{n-1},$$

of the Galois input on said n, Y input lines of $$G(Y) = y_0, \ldots y_{n-1};$$

and of the Galois input on said n, Z input lines of $$G(Z) = z_0, \ldots z_{n-1};$$

said parity predict network comprising:
a parity predict parity tree;
a parity predict AND gate for receiving the two inputs $$X_p = x_0 \oplus \ldots \oplus x_{n-1},$$

which is the parity of the Galois input on said n, X input lines, and $$Y_p = y_0 \oplus \ldots \oplus y_{n-1},$$

which is the parity of the Galois input on said n, Y input lines for generating the product of the parities $x_p y_p$ as an output therefrom;
means coupling the output of said parity predict AND gate as an input to said parity predict parity tree;
means coupling the input $$Z_p = z_0 \oplus \ldots \oplus z_{n-1},$$

which is the parity of the Galois input on said n, Z input lines as an input to said parity predict parity tree;
means coupling only the outputs of said first level parity trees that are inputs to an even number of said n, output, second level parity trees as inputs to said parity predict parity tree for generating the parity predict $P_p$ as an output therefrom.

8. The linear gate of claim 7 further including:
a parity of the product parity tree;
a parity error indicator parity tree;
means coupling the outputs of said n, output, second level parity trees to said parity of the product parity tree for generating the parity of the product $(xy+z)_p$ as an output therefrom;
means coupling the output of said parity of the product parity tree as a first input to said parity error indicator parity tree; and,
means coupling the output of said parity predict parity tree to said parity error indicator parity tree for generating the parity error indicator $E_p$ as an output therefrom.

9. A method of constructing a parity predict network for an M-level, N'th power, Galois multiplication gate, which multiplication gate is comprised of:
a matrix array of n, X input lines $x_0, \ldots x_{n-1}$ and n, Y input lines $y_0, \ldots y_{n-1}$ for forming the $n^2$ intersections $x_0y_0, x_0y_1, \ldots x_{n-1}y_{n-2}, x_{n-1}y_{n-1}$, said matrix array including $n^2$, two-input AND gates, a separate one having its two inputs coupled across the X input line and the Y input line of an associated one of said $n^2$ intersections;

1 through $m$-1 levels of parity trees;

$n$, output, $m$-level parity trees;

means intercoupling said $n^2$ AND gates, said 1 through $m$-1 levels of parity trees and said $n$, output, $m$-level parity trees for generating as the outputs of said $n$, output, $m$-level parity trees, the Galois multiplication resultant $$G(XY) = (xy)_0, \ldots (xy)_{n-1},$$

of the Galois input on said $n$, X input lines of $$G(X) = x_0, \ldots x_{n-1},$$

and of the Galois input on said $n$, Y input lines of $$G(Y) = y_0, \ldots y_{n-1};$$

said method comprising:

coupling the two inputs $$X_p = x_0 \oplus, \ldots \oplus x_{n-1},$$

which is the parity of the Galois input on said $n$, X input lines, and $$Y_p = y_0 \oplus, \ldots \oplus y_{n-1},$$

which is the parity of the Galois input on said $n$, Y input lines as two separate inputs to a parity predict AND gate;

coupling only the inputs to said 1 through $m$ levels of parity trees that are inputs to an even number of parity trees of said 1 through $m$ levels of parity trees as inputs to a parity predict tree; and, coupling the output of said parity predict AND gate as an input to said parity predict parity tree for generating the parity predict $P_p$ as an output therefrom.

10. The method of claim 9 further including:

coupling the outputs of said $n$, output, $m$-level parity trees to a parity of the product parity tree for generating the parity of the product $(xy)_p$ as an output therefrom;

coupling the output of said parity of the product parity tree as a first input to a parity error indicator parity tree;

coupling the output of said parity predict parity tree as a second input to said parity error indicator parity tree for generating the parity error indicator $E_p$ as an output therefrom.

11. A parity predict network for an M-level, Galois multiplication gate that is comprised of:

a matrix array of $n$, X input lines $x_0, \ldots x_{n-1}$ and $n$, Y input lines $y_0, \ldots y_{n-1}$ for forming the $n^2$ intersections $x_0y_0, x_0y_1, \ldots x_{n-1}y_{n-2}, x_{n-1}y_{n-1}$, said matrix array including $n^2$, two-input AND gates, a separate one having its two inputs coupled across the X input line and the Y input line of an associated one of said $n^2$ intersections;

1 through $m$-1 levels of parity trees;

$n$, output, $m$-level parity trees;

means intercoupling said $n^2$ AND gates, said 1 through $m$-1 levels of parity trees and said $n$, output, $m$-level parity trees for generating as the outputs of said $n$, output, $m$-level parity trees, the Galois multiplication resultant $$G(XY) = (xy)_0, \ldots (xy)_{n-1},$$

of the Galois input on said $n$, X input lines of $$G(X) = x_0, \ldots x_{n-1},$$

and of the Galois input on said $n$, Y input lines of $$G(Y) = y_0, \ldots y_{n-1};$$

said parity predict network comprising:

a parity predict parity tree;

a parity predict AND gate for receiving the two inputs $$X_p = x_0 \oplus, \ldots \oplus x_{n-1},$$

which is the parity of the Galois input on said $n$, X input lines, and $$Y_p = y_0 \oplus, \ldots \oplus y_{n-1},$$

which is the parity of the Galois input on said $n$, Y input lines;

means coupling the output of said parity predict AND gates an input to said parity predict parity tree;

means coupling only the inputs to said 1 through $m$ levels of parity trees that are inputs to an even number of parity trees of said 1 through $m$ levels of parity trees as inputs to said parity predict parity tree for generating the parity predict $P_p$ as an output therefrom.

12. The multiplication gate of claim 11 further including:

a parity of the product parity tree;

a parity error indicator parity tree;

means coupling the outputs of said $n$, output, $m$-level parity trees to said parity of the product parity tree for generating the parity of the product $(xy)_p$ as an output therefrom;

means coupling the output of said parity of the product parity tree as a first input to said parity error indicator parity tree; and, means coupling the output of said parity predict parity tree to said parity error indicator parity tree for generating the parity error indicator $E_p$ as an output therefrom.

13. A method of constructing a parity predict network for an M-level, N'th power Galois linear gate, which linear gate is comprised of:

a matrix array of $n$, X input lines $x_0, \ldots x_{n-1}$ and $n$, Y input lines $y_0, \ldots y_{n-1}$ for forming the $n^2$ intersections $x_0y_0, x_0y_1, \ldots x_{n-1}y_{n-2}, x_{n-1}y_{n-1}$, said matrix array including $n^2$, two-input AND gates, a separate one having its two inputs coupled across the X input line and the Y input line of an associated one of said $n^2$ intersections;

1 through $m$-1 levels of parity trees;

$n$, output, $m$-level parity trees;

$n$, Z input lines $z_0, \ldots z_{n-1}$;

means intercoupling said $n^2$ AND gates and said 1 through $m$ levels of parity trees for generating as the outputs of said $n$, output, $m$-level parity trees, the Galois linear resultant $$G(XY+Z) = (xy+z)_0, \ldots (xy+z)_{n-1},$$

of the Galois input on said $n$, X input lines of $$G(X) = x_0, \ldots x_{n-1},$$

of the Galois input on said $n$, Y input lines of $$G(Y) = y_0, \ldots y_{n-1};$$

and of the Galois input on said $n$, Z input lines of $$G(Z) = z_0, \ldots z_{n-1};$$

said method comprising:
coupling the two inputs $$X_p = x_0 \oplus \ldots \oplus x_{n-1},$$

which is the parity of the Galois input on said $n$, X input lines, and $$Y_p = y_0 \oplus \ldots \oplus y_{n-1},$$

which is the parity of the Galois input on said $n$, Y input lines as two separate inputs to a parity predict AND gate;
coupling the input $$Z_p = z_0 \oplus \ldots \oplus z_{n-1},$$

which is the parity of the Galois input on said $n$, Z input lines as an input to a parity predict parity tree;
coupling the output of said parity predict AND gate as an input to said parity predict parity tree; and,
coupling only the inputs to said 1 through $m$ levels of parity trees that are inputs to an even number of parity trees of said 1 through $m$ levels of parity trees as inputs to said parity predict parity tree for generating the parity predict $P_p$ as an output therefrom.

14. The method of claim 13 further including:
coupling the outputs of said $n$, output, $m$-level parity trees to a parity of the product parity tree for generating the parity of the product $(XY+Z)_p$ as an output therefrom;
coupling the output of said parity of the product parity tree as a first input to a parity error indicator parity tree;
coupling the output of said parity predict parity tree as a second input to said parity error indicator parity tree for generating the parity error indicator $E_p$ as an output therefrom.

15. A parity predict network for an M-level, Galois linear gate that is comprised of:
a matrix array of $n$, X input lines $x_0, \ldots x_{n-1}$ and $n$, Y input lines $y_0, \ldots y_{n-1}$ for forming the $n^2$ intersections $x_0y_0, x_0y_1, \ldots x_{n-1}y_{n-2}, x_{n-1}y_{n-1}$, said matrix array including $n^2$, two-input AND gates, a separate one having its two inputs coupled across the X input line and the Y input line of an associated one of said $n^2$ intersections;
1 through $m$ levels of parity trees;
$n$, output, $m$-level parity trees;
$n$, Z input lines $z_0, \ldots z_{n-1}$;
means intercoupling said $n^2$ AND gates and said 1 through $m$ levels of parity trees for generating as the outputs of said $n$, output, $m$-level parity trees, the Galois multiplication resultant $$G(XY) = (xy)_0, \ldots (xy)_{n-1},$$

of the Galois input on said $n$, X input lines of $$G(X) = x_0, \ldots x_{n-1},$$

of the Galois input on said $n$, Y input lines of $$G(Y) = y_0, \ldots y_{n-1};$$

and of the Galois input on said $n$, Z input lines of $$G(Z) = z_0, \ldots z_{n-1};$$

said parity predict network comprising:
a parity predict parity tree;
a parity predict AND gate for receiving the two inputs $$X_p = x_0 \oplus \ldots \oplus x_{n-1},$$

which is the parity of the Galois input on said $n$, X input lines, and $$Y_p = y_0 \oplus \ldots \oplus y_{n-1},$$

which is the parity of the Galois input on said $n$, Y input lines for generating the product of the parities $x_p y_p$ as an output therefrom;
means coupling the output of said parity predict AND gate as an input to said parity predict parity tree;
means coupling the input $$Z_p = z_0 \oplus \ldots \oplus z_{n-1},$$

which is the parity of the Galois input on said $n$, Z input lines as an input to said parity predict parity tree;
means coupling only the inputs to said 1 through $m$ levels of parity trees that are inputs to an even number of parity trees of said 1 through $m$ levels of parity trees as inputs to said parity predict tree for generating the parity predict $P_p$ as an output therefrom.

16. The linear gate of claim 15 further including:
a parity of the product parity tree;
a parity error indicator parity tree;
means coupling the outputs of said n, output, m-level parity trees to said parity of the product parity tree for generating the parity of the product $(xy+z)_p$ as an output therefrom;
means coupling the output of said parity of the product parity tree as a first input to said parity error indicator parity tree; and,
means coupling the output of said parity predict parity tree to said parity error indicator parity tree for generating the parity error indicator $E_p$ as an output therefrom.

* * * * *

UNITED STATES PATENT OFFICE
CERTIFICATE OF CORRECTION

Patent No. 4,035,626             Dated July 12, 1977

Inventor(s) Bruce A. Christensen

It is certified that error appears in the above-identified patent and that said Letters Patent are hereby corrected as shown below:

Column 4, line 17, "$(xy)_p x_p y_p =$" should be --$(xy)_p \oplus x_p y_p =$--.

Column 6, line 32, "$G(Y) = Y_0, \ldots Y_{n-1},$" should be --$G(Y) = y_0, \ldots y_{n-1},$--.

Column 10, line 60, "$X_{n-1}$" should be --$x_{n-1}$--.

Column 11, line 32, "gate; coupling the input" should be printed as the end of one paragraph and the start of another, --gate;

coupling the input--.

Column 11, line 40, "coupling only to the outputs" should be --coupling only the outputs--.

UNITED STATES PATENT OFFICE
CERTIFICATE OF CORRECTION

Patent No. 4,035,626          Dated July 12, 1977

Inventor(s) Bruce A. Christensen

It is certified that error appears in the above-identified patent and that said Letters Patent are hereby corrected as shown below:

Column 16, line 45, "parity trees as inputs to said parity predict tree for" should be --parity trees as inputs to said parity predict parity tree for--.

Signed and Sealed this

Twenty-seventh Day of September 1977

[SEAL]

Attest:

RUTH C. MASON
Attesting Officer

LUTRELLE F. PARKER
Acting Commissioner of Patents and Trademarks